United States Patent [19]
Sasame et al.

[11] Patent Number: 5,529,852
[45] Date of Patent: Jun. 25, 1996

[54] ALUMINUM NITRIDE SINTERED BODY HAVING A METALLIZED COATING LAYER ON ITS SURFACE

[75] Inventors: Akira Sasame; Hitoyuki Sakanoue, both of Hyogo, Japan

[73] Assignee: Sumitomo Electric Industries, Ltd., Osaka, Japan

[21] Appl. No.: 206,885

[22] Filed: Mar. 7, 1994

Related U.S. Application Data

[63] Continuation-in-part of Ser. No. 757,551, Sep. 11, 1991, abandoned, which is a continuation-in-part of Ser. No. 544,818, Jun. 27, 1990, abandoned, which is a continuation of Ser. No. 146,975, Jan. 22, 1988, abandoned.

[30] Foreign Application Priority Data

| Jan. 26, 1987 | [JP] | Japan | 62-16421 |
| Jan. 26, 1987 | [JP] | Japan | 62-16422 |

[51] Int. Cl.$^6$ .......................... C01G 41/00; C22C 38/12
[52] U.S. Cl. .......................... 428/620; 428/209; 428/210; 428/665; 428/680; 252/515
[58] Field of Search .......................... 428/209, 210, 428/699, 620, 665, 680; 292/512, 515, 521; 419/8, 13; 501/96, 98, 125, 153

[56] References Cited

U.S. PATENT DOCUMENTS

| 4,087,778 | 5/1978 | Merz et al. |  |
| 4,493,789 | 1/1985 | Ueyama et al. |  |
| 4,547,471 | 10/1985 | Huseby et al. |  |
| 4,591,537 | 5/1986 | Aldinger et al. |  |
| 4,770,953 | 9/1988 | Horiguchi et al. |  |
| 4,835,039 | 5/1989 | Barringer et al. |  |
| 4,886,709 | 12/1989 | Sasame | 428/552 |
| 4,965,659 | 10/1990 | Sasame | 357/81 |
| 5,010,388 | 4/1991 | Sasame | 357/70 |

FOREIGN PATENT DOCUMENTS

| 75208 | 6/1975 | Japan. |
| 102310 | 9/1978 | Japan. |
| 121175 | 7/1984 | Japan. |
| 132580 | 6/1986 | Japan. |
| 105972 | 5/1987 | Japan. |

*Primary Examiner*—Jenna L. Davis
*Attorney, Agent, or Firm*—W. G. Fasse; W. F. Fasse

[57] ABSTRACT

An aluminum nitride sintered body has a metallized layer on its surface. The metallized layer contains tungsten, aluminum oxide and calcium oxide. Preferably, the metallized layer contains 40 to 96 percent by weight of a metal, 0.4 to 25 percent by weight of an aluminum oxide and 3 to 35 percent by weight of calcium oxide. In a method of forming a metallized layer on the surface of the aluminum nitride sintered body, such body is first formed by firing. Then, a metal paste of tungsten containing powder of calcium oxide and powder of aluminum oxide is provided. The metal paste is coated on the surface of the aluminum nitride sintered body which is then fired with the metal paste in an inert atmosphere.

14 Claims, 12 Drawing Sheets

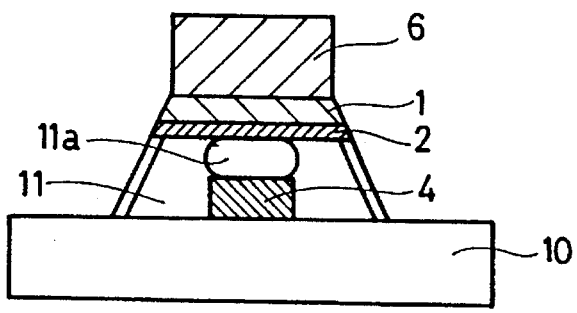
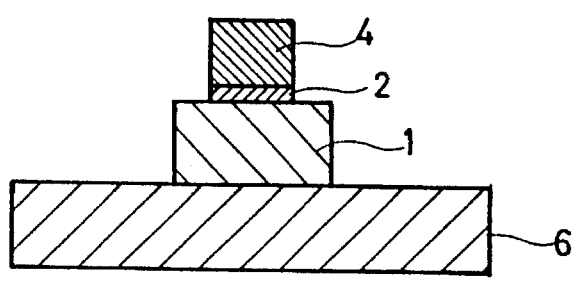
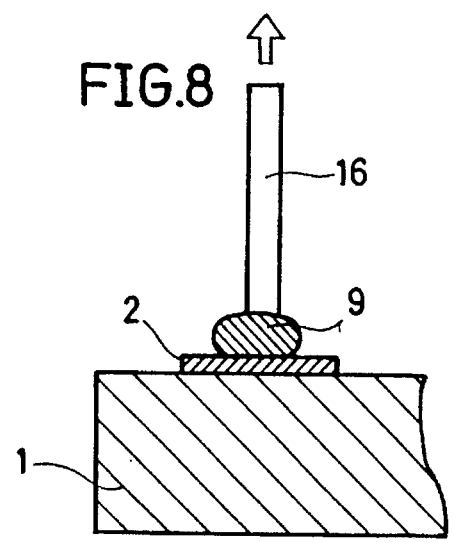
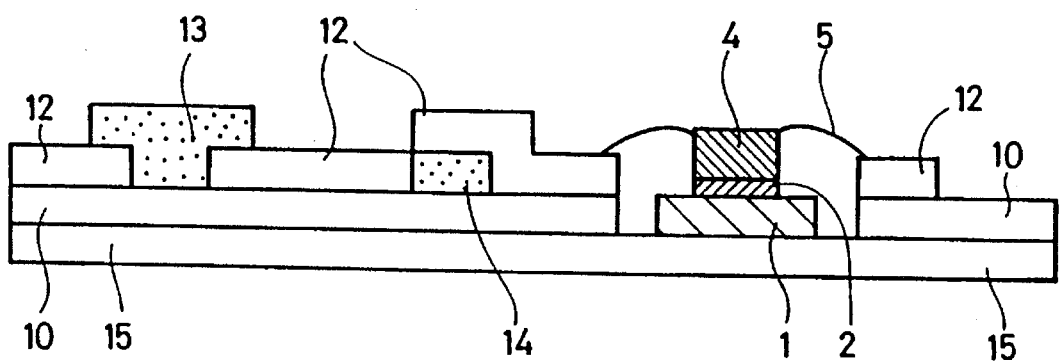

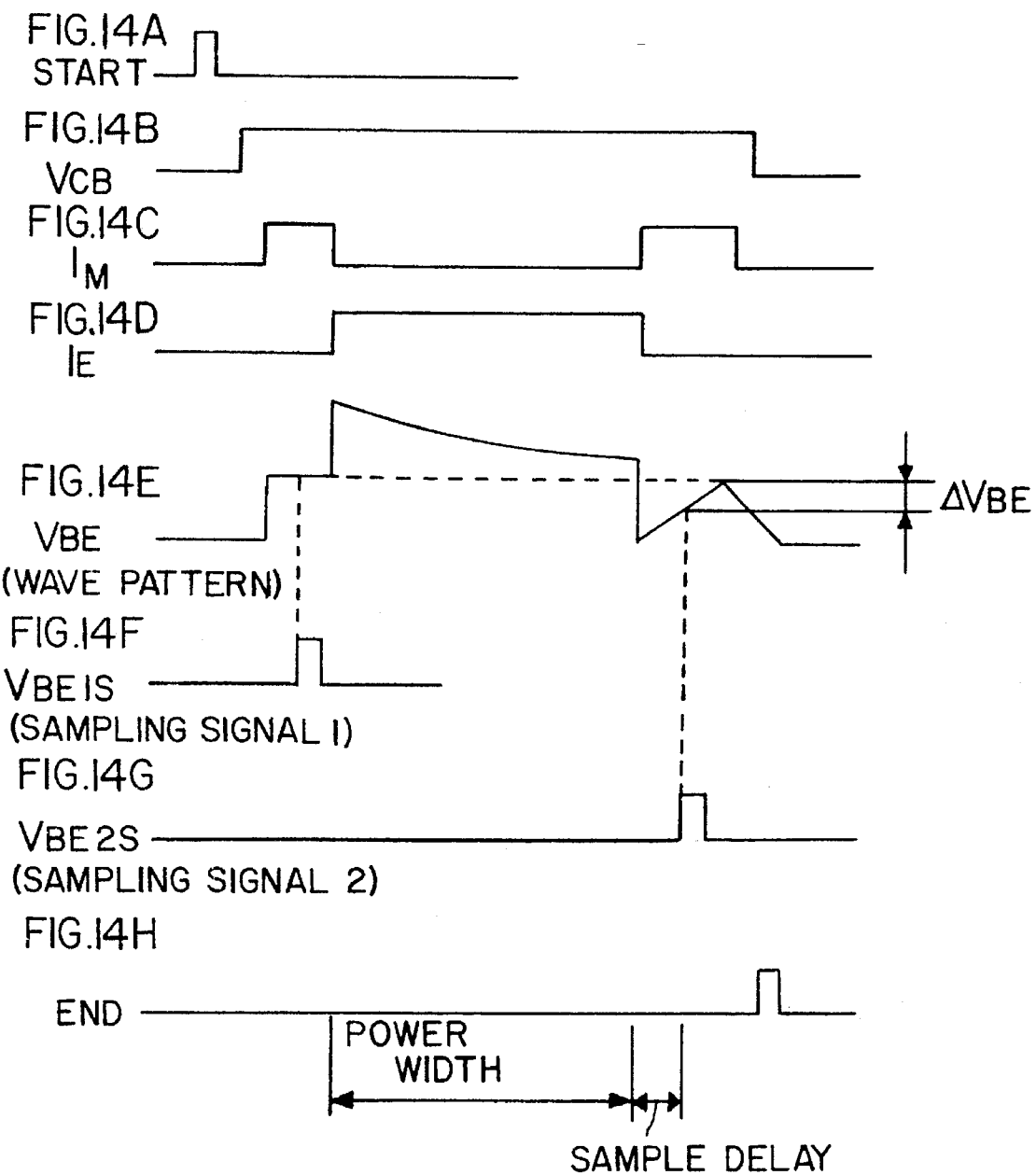

ALUMINUM NITRIDE SINTERED BODY HAVING A METALLIZED COATING LAYER ON ITS SURFACE

CROSS-REFERENCE TO RELATED APPLICATIONS

The present application is a continuation-in-part application of our application Ser. No. 07/757,551, filed on Sep. 11, 1991, now abandoned. The parent application, U.S. application Ser. No. 07/757,551 was a continuation-in-part application of U.S. application Ser. No. 07/544,818, filed on Jun. 27, 1990, now abandoned. U.S. application Ser. No. 07/544,818 was a File-Wrapper-Continuation of U.S. application Ser. No. 07/146,975, filed on Jan. 22, 1988, now abandoned.

FIELD OF THE INVENTION

The present invention relates to an aluminum nitride sintered body having a metallized layer on its surface. The metallized layer is made of tungsten or molybdenum. The invention further relates to a method of manufacturing the same. The aluminum nitride sintered body is applied to a package for a semiconductor device etc., to have mounted thereon a semiconductor element of high calorific power.

BACKGROUND INFORMATION

In general, an insulating substrate, which is applied to a package for a semiconductor device etc. is made of alumina ($Al_2O_3$). A lead frame is generally made of iron-nickel alloy such as Kovar (trade name for an Fe-29%Ni-17%Co alloy) or 42 alloy (Fe-42%Ni). The lead frame is brazed to a metal layer part of an insulating substrate, which is provided with a circuit. The brazing is performed with silver solder or the like for application to a package for a semiconductor device.

However, although alumina is excellent as an electric insulator and for mechanical strength, its heat dissipation property is inferior due to its small thermal conductivity of 30 W/mK. Thus, it is improper to mount a field-effect transistor (FET) of high calorific power, for example, on an alumina substrate. For mounting a semiconductor element of high calorific power, another type of insulating substrate is made of beryllia (BeO) having a high thermal conductivity of 250 W/mK. However, beryllia is toxic and hence it is troublesome to satisfy safety requirements in connection with such an insulating substrate.

In recent years, nontoxic aluminum nitride (AlN) has generated great interest as a material for making such insulating substrates for carrying a semiconductor element of high calorific power, because of its high thermal conductivity of 220 W/mK. This value is nearly equal to that of beryllia. The electric insulation ability and the mechanical strength of aluminum nitride are equivalent to those of alumina.

A sintered body of aluminum nitride (AlN), having a high thermal conductivity and an excellent mechanical strength, is being watched as a material which is usable as an insulating substrate for a semiconductor integrated circuit device (IC) and as a substrate for forming an electric circuit, such as a power module. However, since such an aluminum nitride sintered body is inferior in its wetting property relative to a metal, so that a sufficient adhesive strength cannot be obtained in laminating a metal layer on the surface of an aluminum nitride substrate for a semiconductor integrated circuit such as a power transistor. Although various attempts have been made to metallize the surfaces of such AlN sintered compacts, no satisfactory method has been proposed so far.

A technique relating to such an aluminum nitride sintered body is disclosed in U.S. Pat. No. 4,547,471, for example. Further, Japanese Patent Publication No. 121175/1984, for example, discloses a method for metallizing the surface of an aluminum nitride sintered body obtained through said technique.

This prior art discloses generally to use a molybdenum paste and a copper paste, although compositions thereof are not concretely defined. Japanese Patent Publication No. 132580/1986 discloses a method for metallizing a nitride ceramic body which has formed on its surface a metallized layer by adding Mo, W, Mn, etc. to MgO, AlN, $Y_2O_3$ or SiOn. Japanese Patent Publication No.: 105972/1987 discloses a method for forming a cracked oxide layer on the surface of an aluminum nitride sintered body and thereafter coating a vitreous adhesive agent on the surface of the oxide layer.

Further, Japanese Patent Publication No. 75208/1975 discloses a method of metallizing the surface of an aluminum nitride sintered body by oxidizing the surface of the aluminum nitride sintered body and sintering a metal such as Mo, W, Mn or Ti on the surface thereof. Japanese Patent Publication No. 102310/1978 discloses a heat-conductive substrate comprising a sintered substrate of aluminum nitride and a metal layer of Mo, W, Mo-W system or an Mo-Mn system formed as a metal oxide layer such as an oxide layer containing $SiO_2$, $Al_2O_3$, MgO, CaO or $Fe_2O_3$, for example, formed on a prescribed surface of the substrate.

On the other hand, the so-called Telefunken method of coating a paste of tungsten or tungsten-manganese (or molybdenum or molybdenum-manganese) on the surface of a sintered body and firing the same in wet hydrogen or a wet $H_2$—$H_2$ gas mixture at a temperature of 1300° to 1700° C. is well known as a technique for metallizing a sintered body of aluminum oxide ($Al_2O_3$).

The Telefunken method is characterized in that the $Al_2O_3$ sintered body is fired in a wet atmosphere at a temperature sufficient for softening the $Al_2O_3$ sintered compact to its glassy plane.

The surface of W and/or Mn is oxidized by such a firing, to accelerate the sintering of the paste of W or W-Mn. Oxides of such materials are dissolved in the glassy phase of the sintered body to improve the flowability of the glassy phase, whereby the glassy phase is transferred to a porous metallized layer of W or W-Mn. Further, the oxides generated by the firing, particularly MnO reacts with $Al_2O_3$ and $SiO_2$ contained in the sintered body, to form $MnO·Al_2O_3$ and $MnO·SiO_2$. Similarly, W is partially oxidized to generate tungsten oxide, which strongly reacts with alumina. Thus, the metallized layer of W or W-Mn (or Mo or Mo-Mn) strongly adheres to the $Al_2O_3$ sintered body through mechanical and chemical bonding, with an adhesive strength of about 4 to 7 kg/mm².

Thus, it may be assumed that an AlN sintered body can be metallized through the aforementioned Telefunken method. According to that method, however, a metallized layer of W or W-Mn formed on the surface of an AlN sintered body has merely a low adhesive strength and the airtightness is extremely inferior. Possible causes therefor are as follows:

(a) Since firing is performed in a wet atmosphere according to the Telefunken method, the surface of the AlN sintered body is corroded by steam or decomposed to form a fragile $Al_2O_3$ layer.

(b) Dissimilarly to the $Al_2O_3$ sintered body, the AlN sintered body is not provided with any glassy phase, etc. which is softened at a low temperature of about 1000° to 1500° C.

(c) AlN is inferior in fits ability to react with W, Mn and oxides thereof.

When the metallized layer formed on the surface of an AlN sintered body, which is applied to a substrate for a semiconductor integrated circuit device, has a small adhesive strength, the metallized layer is easily peeled off by a heat applied in the manufacturing steps. Further, insufficient airtightness of the metallized layer leads to an inferior strength and to an insufficient sealing property. Finally, the thermal resistance of the metallized layer is higher, i.e. less desirable, when the layer does not adhere well to the substrate.

In order to apply the Telefunken method to the metallization of an AlN sintered body, the present inventors have attempted to add glass and other presumably suitable materials such as $Y_2O_3$ or CaO to a paste of W or W—Mn for firing the same in an inert atmosphere. However, it has been impossible to solve the aforementioned problem relating to adhesive strength and airtightness. When employing glass, the metallized layer did not strongly adhere to the sintered body due to an inferior wetting property of the remaining W or Mn and AlN with glass. When employing $Y_2O_3$ or CaO, a reaction layer was slightly formed at a firing temperature of at least about 1600° C., but the metallized layer thus obtained was extremely porous and its adhesive strength was low due to the high melting point and no liquid phase was formed in the metallized layer.

U.S. Pat. No. 4,835,039 (Barringer et al.) discloses a tungsten paste for co-sintering with pure alumina and a method for producing the same. The method according to Barringer et al. involves mixing tungsten powder with an alkaline earth aluminosilicate glass powder having 10 to 38 wt. % alkaline earth, 10 to 52 wt. % alumina and 10 to 70 wt. % silica. The mixture is applied to an alumina tape and fired at between 1450° C. and 1550° C. in a wet atmosphere of dissociated ammonia and nitrogen (50% $H_2$ and 50% $N_2$) and water vapor.

U.S. Pat. No. 4,493,789 (Ueyama et al.) discloses an electroconductive paste and a method for producing metallized ceramics using the same. The method according to Ueyama et al. involves mixing 100 parts by weight of a high melting metal powder, such as tungsten powder, with 0.1 to 3 parts by weight of an additive mixture including MgO, CaO, $SiO_2$, $Al_2O_3$, for example. The mixture is coated on an alumina substrate and is then fired at a temperature of 1400° C. to 1700° C. in an atmosphere containing water and a mixture of gases, such as $N_2$ and $H_2$ gases.

The metallized layers produced according to Barringer et al. and Ueyama et al. do not achieve the low thermal resistivity of the present invention, as will be discussed below. Furthermore, as described above, the present inventors have determined that the wet firing methods are not compatible with aluminum nitride sintered bodies for achieving good metallization results thereon.

SUMMARY OF THE INVENTION

It is an object of the invention to overcome the aforementioned problem by providing an aluminum nitride sintered body with a metallized layer of tungsten, which strongly adheres to the surface of the aluminum nitride sintered body and which has a high thermal conductivity or rather a low thermal resistance for a good heat transfer through the metallized layer to the aluminum nitride sintered body which preferably functions as a heat sink, e.g. for a semiconductor device mounted on the metallized layer. Such layer shall also provide an excellent airtightness when, for example, a semiconductor device is mounted on said metallized layer. A method of manufacturing such a body is also disclosed.

In the aluminum nitride sintered body formed with a metallized layer according to the present invention, the metallized layer contains tungsten, at least one aluminum compound namely aluminum oxide, and calcium oxide, whereby the aluminum oxide is within the range of 0.4 to 10% (wt.), preferably 1 to 10% (wt.) and more preferably 1 to 5% (wt.), the calcium oxide is within the range of 3 to 15% (wt.), and the remainder of the metallized layer is tungsten. These ranges are critical for obtaining the desired low thermal resistance of 1.9° C./W for the metallized layer.

A method of forming a metallized layer on the surface of an aluminum nitride sintered body of the present invention comprises: (I) a step of preparing an aluminum nitride sintered body which is previously fired and has a prescribed configuration; (II) a step of preparing a paste of at least a metal selected from tungsten and molybdenum, containing powder of at least a calcium compound selected from a group of calcium oxide, calcium nitrate and calcium carbonate and powder of at least an aluminum compound selected from a group of aluminum nitride, aluminum oxide and aluminum oxynitride; (III) a step of coating the metal paste on the surface of the aluminum nitride sintered body; and (IV) a step of firing the aluminum nitride sintered body coated with the metal paste in an inert, preferably dry, atmosphere.

In the present invention, it is believed that the calcium oxide (CaO), including that formed by decomposition of $CaCO_3$ or $Ca(NO_3)_2$ through firing, has a high reactivity with an aluminum compound, to easily react with the aluminum compound contained in the metal paste at a temperature in excess of 1500° C., thereby to form a liquid phase of these compounds. This liquid phase has a high chemical affinity to W or Mo, whereby the same can be sufficiently fired in an inert atmosphere such as nitrogen without employing the firing step performed in a wet atmosphere in the general Telefunken method, to obtain a metallized layer of excellent qualities. The liquid phase has an extremely high wetting property and reactivity with an AlN sintered body, whereby the metallized layer is bonded to the AlN sintered body with a strong adhesion. Further, the liquid phase penetrates the grain boundary phase of W or Mo at a temperature in excess of 1500° C. and it greatly accelerates the sintering of W or Mo, so that the metallized layer obtained after firing has an excellent airtightness with no pores. According to the present manufacturing method, calcium oxide can be replaced by calcium nitrate or calcium carbonate, which is decomposed in the firing to form calcium oxide, whereby a similar function or effect is obtained.

In the manufacturing method according to the present invention, powder of a calcium compound and that of an aluminum compound is mixed into a paste of tungsten or molybdenum to be coated on the surface of an AlN sintered body, which in turn is fired in an inert, substantially dry, atmosphere such as $N_2$ or Ar at a temperature of 1500° to 1800° C., so that CaO reacts with the aluminum compound and the reaction product is softened or melted to accelerate the sintering. The reaction product simultaneously infiltrates into pores of a metallized layer of tungsten or molybdenum to be formed, thereby increasing the mechanical bonding of the metallized layer and improving the airtightness thereof. The reaction product reacts not only with an AlN on the surface of the sintered body, but with a sintering assistant component contained in a grain boundary phase of AlN while causing a mass transfer between the same and the grain boundary phase, whereby the adhesive strength of the metallized layer and the AlN sintered body and the airtightness are further improved. The airtightness can be improved still further by plating the metallized layer with a nickel or similar coating.

In a preferred embodiment of the aluminum nitride sintered body according to the present invention, the metallized layer formed on the surface thereof preferably contains 40 to 96 percent by weight of the metal, 1 to 25 percent by weight of the aluminum compound and 3 to 35 percent by weight of calcium oxide. The above described function or effect can be obtained even if the respective contents of the aluminum compound and of the calcium oxide are small. If the contents of calcium oxide and the aluminum compound, serving as assistants, are increased above the stated upper limits, another problem is caused although no influence is exerted on the adhesive strength. The other problem is an increased reaction of the "assistants" which deposits more tungsten or molybdenum on the metal surface, whereby a subsequent plating performed on the metallized layer for improving the airtightness may actually reduce the adhesive property and may even cause an adhesive failure.

According to another preferred embodiment, the metallized layer may contain 1 to 10 percent by weight of the aluminum compound in the form of aluminum oxide, and 1 to 20 percent by weight of calcium oxide where tungsten is used as the metal. In case of using molybdenum as the metal, the metallized layer may contain 1 to 10 percent by weight of the aluminum oxide compound and 1 to 35 percent by weight of calcium oxide. In such a case, an excellent adhesive strength and thermal conductivity can be obtained between the aluminum nitride sintered body and the metallized layer.

When the metal is tungsten and the aluminum compound is aluminum oxide, the metallized layer to be formed may contain 1 to 10 percent by weight of aluminum oxide and 10 to 20 percent by weight of calcium oxide. When the metal is molybdenum and the aluminum compound is aluminum oxide, the metallized layer to be formed may contain 1 to 10 percent by weight of aluminum oxide and 15 to 35 percent by weight of calcium oxide. In this case, the adhesive strength between the aluminum nitride sintered body and the metallized layer is at least about 7 kg/mm².

A metallized layer of tungsten containing 0.4 to 10 percent by weight, preferably 1 to 10 percent by weight and more preferably 1 to 5 percent by weight of aluminum oxide and 3 to 15 percent by weight of calcium oxide, or a metallized layer of molybdenum containing 1 to 7 percent by weight of aluminum oxide and 1 to 35 percent by weight of calcium oxide has a preferred thermal conductivity, that is to say, a desirable thermal resistance. The value of the thermal resistance is used for evaluating thermal properties of a semiconductor device such as a transistor or a diode. This value generally encompasses the thermal resistance of a whole IC device unit including a semiconductor device such as a transistor, as well as the metallized layer, AlN sintered body and peripheral parts, etc. Thus, this thermal resistance value varies depending upon conditions such as the shape or the material of the semiconductor device. However, if the semiconductor device is evaluated under the same conditions, the thermal resistance value of the metallized layer becomes the dominant factor in the total thermal resistance value of the integrated semiconductor device unit. Therefore, the whole thermal resistance of the device depends heavily on the characteristics of the metallized layer.

A metallized layer of tungsten containing 1 to 5 percent by weight of aluminum oxide, and 1 to 15 percent by weight of calcium oxide and a metallized layer of molybdenum containing 1 to 5 percent by weight of aluminum oxide and 1 to 25 percent by weight of calcium oxide have a particularly excellent adhesion to a plating applied to a surface of the metallized layer.

The metal paste may be formed by kneading powder of a calcium compound, powder of an aluminum compound and powder of tungsten or molybdenum. Another way of forming the paste is first mixing a powder of a calcium compound and a powder of an aluminum compound, firing the mixture to provide a fired substance and kneading a powder of the fired substance and a powder of tungsten or molybdenum.

The aluminum nitride sintered body obtained according to the present invention is useful to form a substrate for a package or housing of a semiconductor device, since the metallized layer formed on its surface has an excellent adhesive strength. Further, the metallized layer on the surface of an aluminum nitride sintered body has a particularly excellent thermal conductivity, making it useful for forming a part of a heat sink for a semiconductor device. A cap for airtightly sealing a package of a semiconductor device may also be made of the present sintered body.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a sectional view showing another embodiment of the aluminum nitride sintered body according to the present invention, which is applied as a part of a cap for airtightly sealing a package of a semiconductor device;

FIG. 6 is a sectional view showing still another embodiment of the aluminum nitride sintered body according to the present invention, which is applied as a heat sink of a semiconductor device such as a light emitting diode (LED) or a laser diode (LD);

FIG. 7 is a sectional view showing a further embodiment of the aluminum nitride sintered body according to the present invention, which is applied as a submount serving as a substrate for forming an electric circuit such as a hybrid integrated circuit device or a power module;

FIG. 8 is a diagram illustrating a test for measuring the adhesive strength of a metallized layer formed on the surface of an aluminum nitride sintered body according to the present invention;

FIG. 14 is an electrical timing diagram for measuring a thermal resistance using the test circuit of FIG. 13.

DESCRIPTION OF THE PREFERRED EMBODIMENTS AND OF THE BEST MODE OF THE INVENTION

The present aluminum nitride sintered bodies are made as follows.

First, paraffin is added as a binder to powder of aluminum nitride containing 0.01 to 5 percent by weight of yttrium oxide, serving as a sintering assistant, and mixed with the aluminum nitride powder. Thereafter, the mixture is formed to have a prescribed configuration whereupon the formed body is exposed to a temperature up to 1950° C. in a nitrogen atmosphere. The body is held at said temperature for one hour for sintering to obtain a substrate of the aluminum nitride sintered body. The sintered body preferably has a thermal conductivity of at least 150 W/mK. Thus, the sintered body preferably has a small lattice defect. Such a sintered body can be formed by raw materials of high purity through steps avoiding contamination by impurities.

The steps of forming a metallized layer on the surface of the aluminum nitride sintered body obtained by the aforementioned method are performed as follows.

Figure 1:
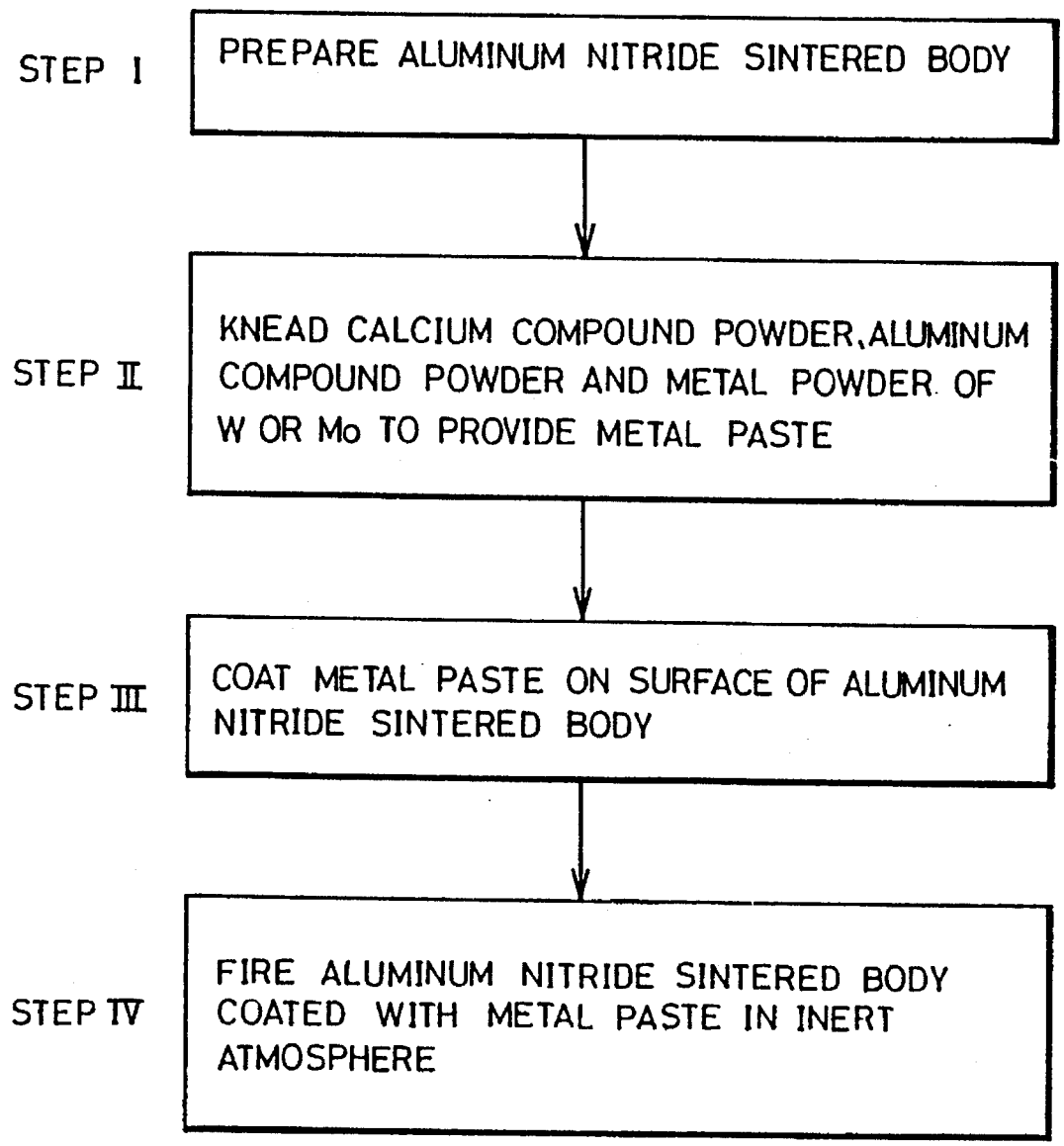
FIG. 1 shows schematically the steps for manufacturing an aluminum nitride sintered body according to the present invention.

Referring to FIG. 1, an aluminum nitride sintered body is first prepared. A material for a metallized layer is prepared by kneading powder of a calcium compound, powder of an aluminum compound and powder of tungsten or molybdenum with an addition of an organic binder, to provide a metal paste. The metal paste is coated on the surface of the aluminum nitride sintered body. This aluminum nitride sintered body is fired in an inert atmosphere at a temperature of 1500° to 1800° C. to form a metallized layer on its surface.

Figure 2:
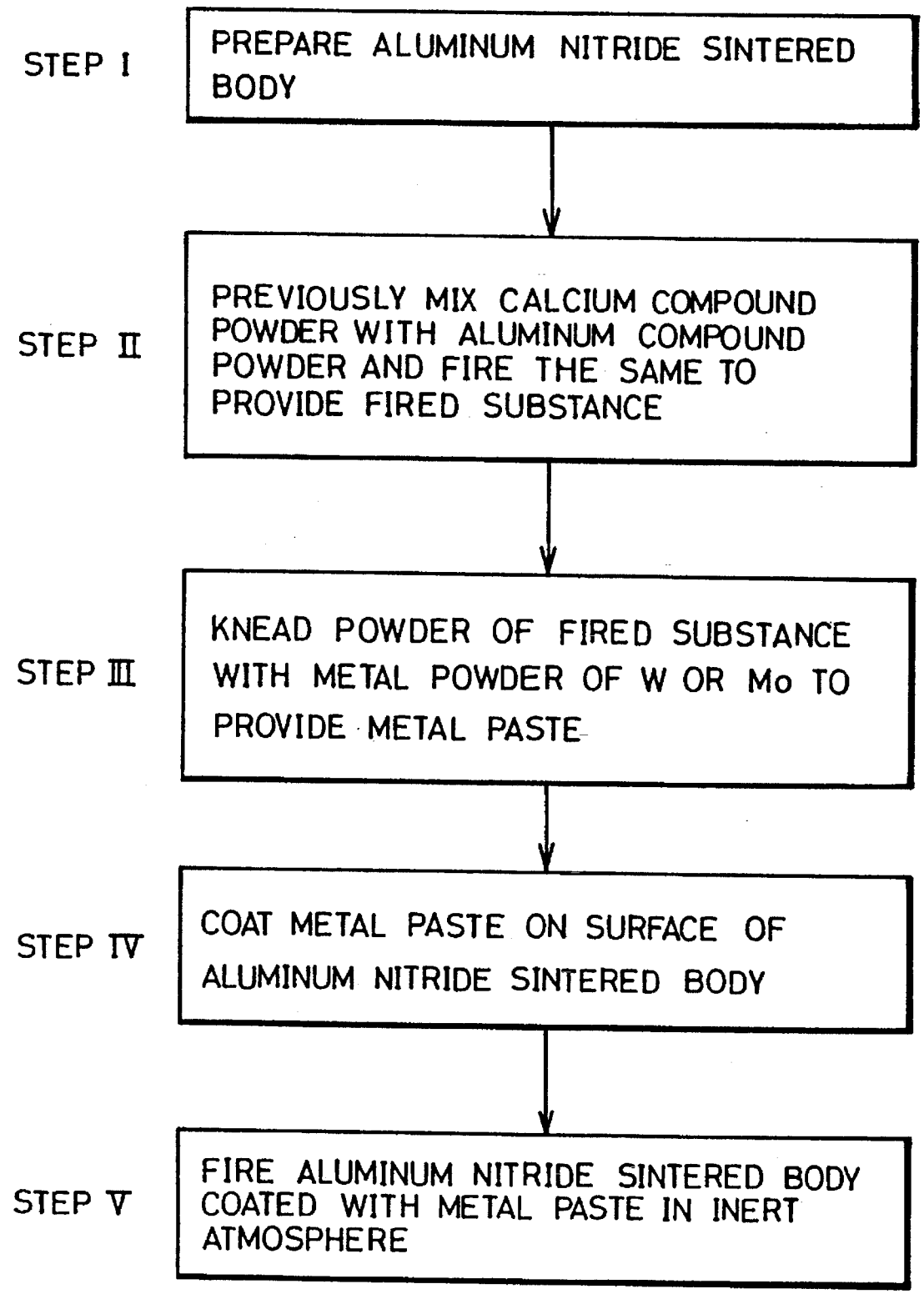
FIG. 2 shows schematically another possibility of manufacturing an aluminum nitride sintered body according to the present invention.

The step II as shown in FIG. 1 may be performed by a process including steps II and III as shown in FIG. 2. Referring to FIG. 2, a material for a metallized layer is prepared by first mixing powder of a calcium compound, powder of an aluminum compound and firing the same to provide a fired substance. The fired substance is pulverized to obtain powder, which is kneaded with powder of tungsten or molybdenum and with an organic binder, to provide a metal paste. This metal paste is coated on the surface of an aluminum nitride sintered body. A further homogeneous metallized layer can be obtained by making the metal paste as just described. The fired substance of calcium and aluminum compounds is obtained by firing the same at a temperature of 1200° to 1500° C.

Figure 3:
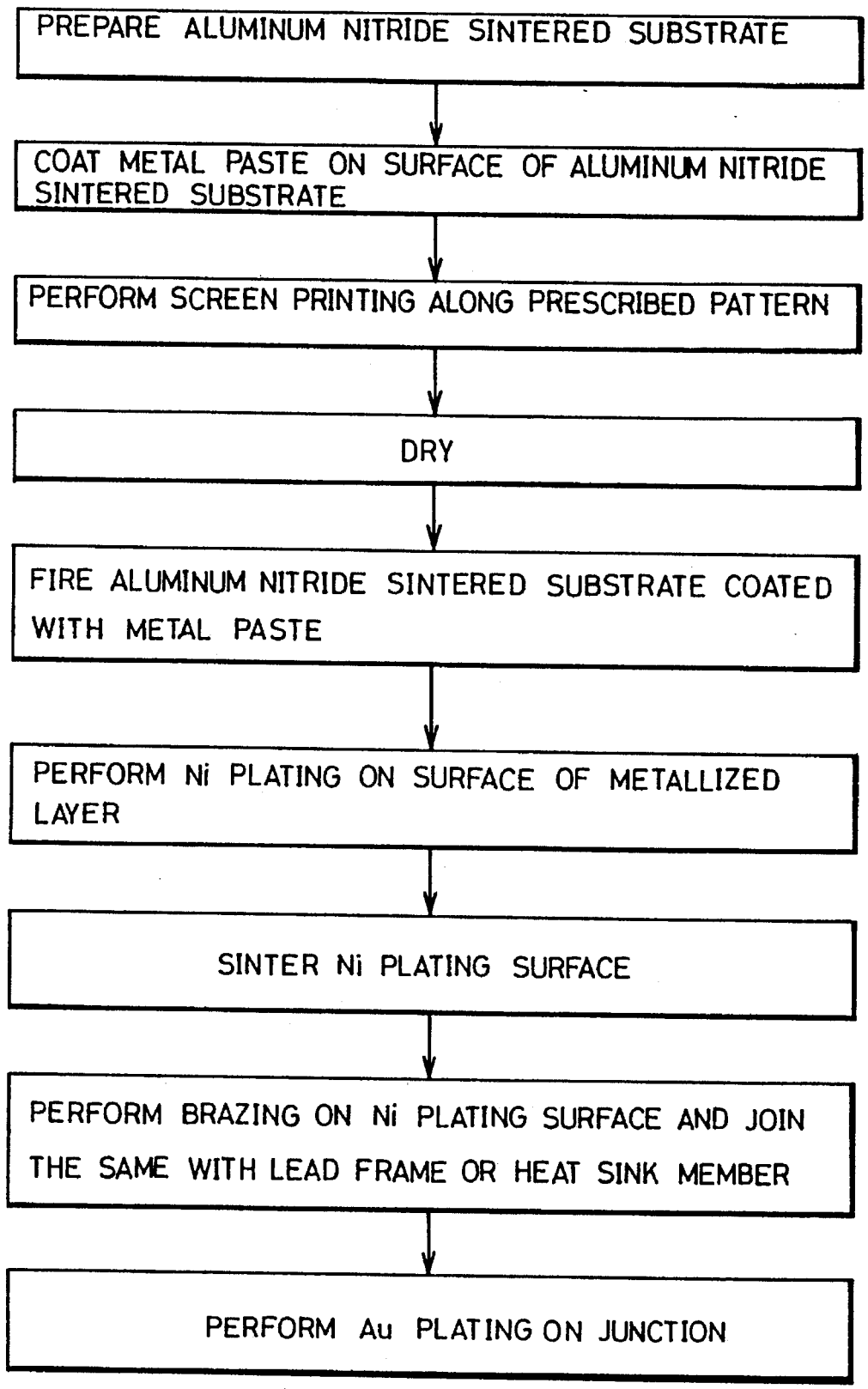
FIG. 3 shows schematically a way of manufacturing an aluminum nitride sintered body as a package of a semiconductor device.

A method of forming a metallized layer on the surface of the aforementioned aluminum nitride sintered body is performed through the following steps, if the aluminum nitride sintered body is to be used in a package of a semiconductor device or the like. Referring to FIG. 3, an aluminum nitride sintered substrate is first made. Then, the metal paste obtained by the aforementioned method is coated on the surface of the substrate. The metal paste coating is screen printed according to a prescribed pattern such as a circuit pattern. After completion of the screen printing the coating is dried. Then, the aluminum nitride sintered substrate with its coating is fired in an inert, preferably dry, gas atmosphere which is heated to a prescribed temperature as set forth above. After the firing step, nickel plating is performed on the surface of a metallized layer. A heat treatment is performed at a temperature of about 900° C. to sinter the nickel plating, thereby to improve the strength and airtightness of the plating. Brazing is performed on the nickel plating surface in order to join the aluminum nitride sintered substrate with a lead frame, a heat sink member or the like. Further, gold plating is performed on such junction. Thus, the aluminum nitride sintered body according to the present invention can be manufactured as a substrate for a semiconductor device.

Figure 4A:
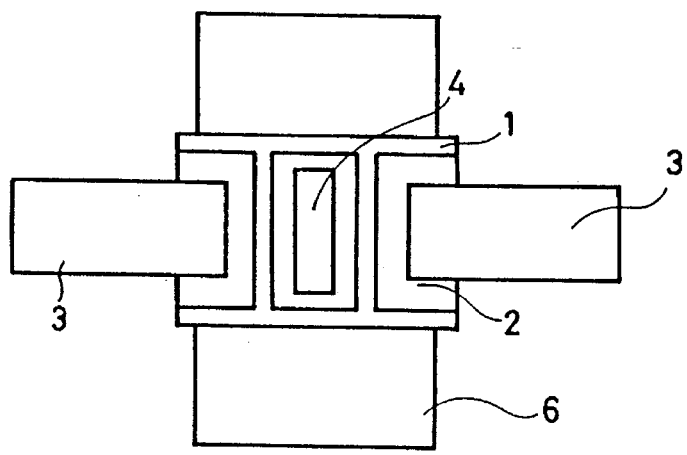
FIGS. 4A, 4B, 4C are a plan view and sectional views showing an embodiment of an aluminum nitride sintered body according to the present invention which is applied as a part of a substrate of a package of a semiconductor device.
Figure 4B:
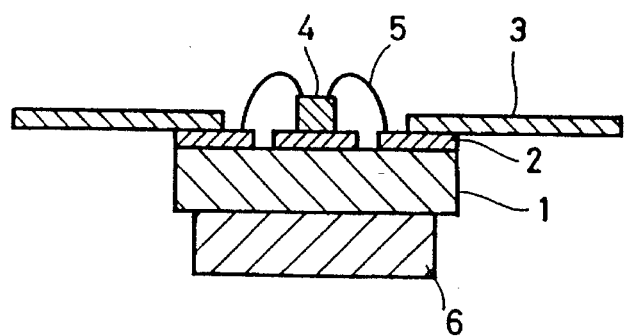
Figure 4C:
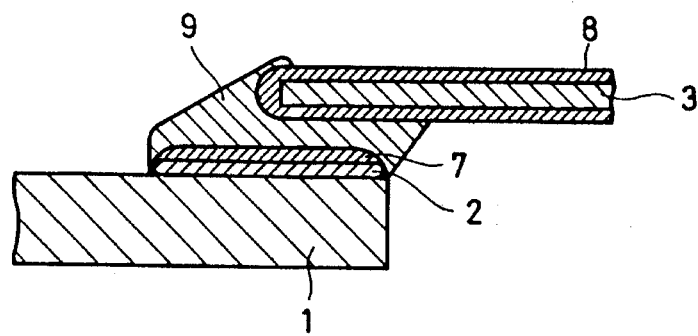

Referring to FIGS. 4A, 4B, and 4C, the present aluminum nitride substrate 1 is partially coated on its surface with a metallized layer 2 in accordance with the present invention. A lead frame 3 is joined to the metallized layer 2 by brazing. A semiconductor element 4 such as an FET of high calorific power, is carried in a prescribed position of the substrate for a semiconductor device, to be connected with the metallized layer 2 or the lead frame 3 by a bonding wire 5 shown in FIG. 4B. Further, a heat sink 6 of Cu-W alloy is mounted on the back surface of the aluminum nitride substrate 1. As shown in FIG. 4C, a plating layer 7 is formed on the metallized layer 2 in the junction between the aluminum nitride substrate 1 and the lead frame 3, while a plating layer 8 is formed where needed on the surface of the lead frame 3, in order to stabilize the wettability of a brazing metal 9.

The present aluminum nitride sintered body may be applied as part of a cap for airtightly sealing a semiconductor device as shown in FIG. 5 illustrating a semiconductor element 4 carried on an $Al_2O_3$ substrate 10. A cap formed by a frame 11 of Kovar (trade name for an Fe-Ni29%-Co17% alloy) and an aluminum nitride sintered body 1 joined to the frame 11, is provided above the semiconductor element 4. The aluminum nitride sintered body 1 has a metallized layer 2 on its surface closer to the frame 11. A compound 11A such as thermally conductive resin lies between the semiconductor element 4 and the metallized layer 2. A heat sink 6 is mounted on the aluminum nitride sintered body 1 to readily dissipate heat generated by the semiconductor element 4.

The present aluminum nitride sintered body may be applied as a heat sink member as shown in FIG. 6 illustrating an aluminum nitride substrate 1 mounted on a heat sink 6 of Cu-W alloy, and a semiconductor element 4 such as a light emitting diode (LED) or a laser diode (LD) joined to the aluminum nitride substrate 1. The semiconductor element 4 is joined to a metallized layer 2 formed on the surface of the aluminum nitride substrate 1. In this case, the aluminum nitride substrate 1 serves as a heat sink member.

The present aluminum nitride sintered body may be applied as a substrate for an electric circuit such as a hybrid integrated circuit device or a power module. FIG. 7 shows an aluminum nitride substrate 1, which is applied to a submount for a semiconductor element in a hybrid semiconductor integrated circuit device (IC). An $Al_2O_3$ substrate 10 is formed on a copper substrate 15. A conductor layer 12, serving as an interconnection layer, is formed on the $Al_2O_3$ substrate 10, while a resistor 13, a capacitor 14 and the like are assembled to form a circuit with elements of the conductor layer. The conductor layer 12 and the semiconductor element 4 are joined with each other by a bonding wire 5. The semiconductor element 4 is mounted on the copper substrate 15 through the aluminum nitride substrate 1. The semiconductor element 4 and the aluminum nitride substrate 1 are joined with each other through a metallized layer 2 which is formed on the surface of the aluminum nitride substrate 1. In this case, heat generated by the semiconductor element 4 is transferred to the aluminum nitride substrate 1, and further transmitted to the copper substrate 15 for dissipating.

Each of the following Examples 1 to 7 was prepared by cutting a substrate of an aluminum nitride sintered body obtained by the aforementioned method, to samples of 10 mm×10 mm×1 mm. These samples were polished.

EXAMPLE 1

CaO powder and $Al_2O_3$ powder in the ratios shown in Table 1 were added to tungsten powder and kneaded with an organic binder vehicle to make a paste. Each paste was coated on the surface of its respective sample. The organic binder was then removed. Thereafter, the sample was fired in a nitrogen atmosphere at a temperature as shown in Table 1 for 30 minutes, to obtain a metallized layer. Nickel plating was performed on the metallized layer of each sample. The tensile strength was then measured as shown in FIG. 8. First, a nickel plating was applied on a prescribed surface part (2 mm by 2 mm) of a metallized layer 2 which was formed on the surface of an aluminum nitride sintered body 1. Second, a stainless wire 16, being subjected to nickel plating and having a diameter of 0.8 mm, was soldered to the layer 2 by a brazing metal 9 such as silver solder. The stainless wire 16 was pulled in the direction of the arrow while holding the substrate 1 to measure the tensile strength. Table 1 also shows the results of such measurement.

Reference examples were prepared employing a paste similar to the above and firing in a wet hydrogen or in a nitrogen and wet $H_2$—$N_2$ gas mixture. Table 1 also shows the measured results of the tensile strength of the reference examples.

Airtightness of the metallized layer in each sample was examined by an He detector. All of the samples fired in accordance with the present invention were excellent in airtightness, while the reference samples were rather inferior in airtightness. The reference sample No. 5 of a tungsten paste was fired in nitrogen, and the remaining samples were fired in wet hydrogen or in a nitrogen and wet $H_2$—$N_2$ gas mixture.

It is clear from Table 1 that the metallized layers formed according to the present invention had a higher junction strength as shown by the tensile strength valves, than the reference examples.

TABLE 1

| W Paste Sample No. | Content (wt. %) $Al_2O_3$ | Content (wt. %) CaO | Firing Temperature (°C.) | Tensile Strength (kg/mm$^2$) |
|---|---|---|---|---|
| 1 | 3 | 2 | 1710 | 4.3 |
| 2 | 4 | 3 | 1700 | 5.4 |
| 3 | 5 | 3 | 1710 | 6.2 |
| 4 | 5 | 5 | 1705 | 8.1 |
| 5 | 5 | 10 | 1710 | 11.2 |
| 6 | 10 | 5 | 1700 | 8.3 |

TABLE 1-continued

| W Paste Sample No. | Content (wt. %) $Al_2O_3$ | Content (wt. %) CaO | Firing Temperature (°C.) | Tensile Strength (kg/mm$^2$) |
|---|---|---|---|---|
| 7 | 10 | 10 | 1710 | 9.4 |
| 8 | 10 | 15 | 1700 | 10.0 |
| 9 | 20 | 15 | 1710 | 6.1 |
| 10 | 25 | 18 | 1705 | 4.4 |
| Reference Examples | | | | |
| 1 | 4 | 3 | 1705 | 1.1 |
| 2 | 5 | 5 | 1710 | 1.2 |
| 3 | 5 | 10 | 1700 | 1.4 |
| 4 | 10 | 10 | 1705 | 0.9 |
| 5 | 0 | 0 | 1715 | 0.6 |

EXAMPLE 2

AlN sintered bodies having metallized layers were prepared similarly to Example 1, except that the CaO was replaced by $CaCO_3$ or $Ca(NO_3)_2$. The firing condition was one hour at a temperature of 1600° C. Table 2 shows the tensile strengths of the samples thus obtained and measured similarly to Example 1. It is clear from Table 2 that the metallized layers formed in accordance with the present invention were excellent in junction strength, similarly to example 1. Further, the samples of Example 2 were also excellent in airtightness, which was measured similarly to Example 1.

TABLE 2

| W Paste Sample No. | Content (wt. %) $Al_2O_3$ | Content (wt. %) $CaCO_3$ | Firing Temperature (°C.) | Tensile Strength (kg/mm$^2$) |
|---|---|---|---|---|
| 1 | 3 | 5 | 1600 | 5.1 |
| 2 | 5 | 8 | 1600 | 7.0 |
| 3 | 6 | 12 | 1600 | 11.1 |
| 4 | 8 | 16 | 1600 | 11.8 |
| 5 | 21 | 17 | 1600 | 5.9 |
| 6 | 3 | 5 | 1600 | 8.4 |
| 7 | 5 | 10 | 1600 | 10.5 |
| 8 | 8 | 14 | 1600 | 10.0 |
| 9 | 15 | 18 | 1600 | 6.8 |
| 10 | 21 | 23 | 1600 | 5.5 |

EXAMPLE 3

CaO powder and AlN powder were added to tungsten powder in each ratio as shown in Table 3 and kneaded with an organic binder vehicle to make a paste. Each paste thus obtained was coated on the surface of each sample prepared by an AlN sintered body and then the binder was removed. Thereafter, the samples were fired in a nitrogen atmosphere at a temperature as shown in Table 3 for minutes, to obtain a metallized layer. The metallized layer of each sample was nickel plated, and the tensile strength was measured similarly to Example 1. Table 3 shows the results of such measurement.

Reference examples were prepared by using a paste similar to the above and firing in a wet hydrogen or in a nitrogen and wet $H_2$—$N_2$ gas mixture. Table 3 also shows the results of the tensile strength of each reference sample measured in a similar manner to the above.

Airtightness of each sample was examined by an He detector. All of the samples fired in accordance with the present invention had an excellent airtightness, while all of the reference samples had a rather inferior airtightness.

It is clear from Table 3 that all of the metallized layers formed in accordance with the present invention had a higher junction strength than the reference samples.

Reference Sample No. 5 using tungsten paste was fired in nitrogen and the remaining samples were fired in a wet hydrogen or a nitrogen and wet $H_2$—$N_2$ gas mixture.

TABLE 3

| W Paste Sample No. | Content (wt. %) AlN | CaO | Firing Temperature (°C.) | Tensile Strength (kg/mm²) |
|---|---|---|---|---|
| 1 | 1 | 1 | 1750 | 5.1 |
| 2 | 3 | 3 | 1750 | 6.2 |
| 3 | 5 | 3 | 1750 | 5.9 |
| 4 | 7 | 7 | 1750 | 7.8 |
| 5 | 10 | 7 | 1750 | 7.5 |
| 6 | 10 | 10 | 1750 | 9.3 |
| 7 | 10 | 14 | 1750 | 10.0 |
| 8 | 15 | 15 | 1750 | 9.2 |
| 9 | 20 | 15 | 1750 | 5.8 |
| 10 | 24 | 16 | 1750 | 4.2 |
| Reference Examples | | | | |
| 1 | 1 | 1 | 1750 | 1.2 |
| 2 | 10 | 10 | 1750 | 1.4 |
| 3 | 20 | 15 | 1750 | 1.5 |
| 4 | 0 | 0 | 1750 | 1.3 |
| 5 | 0 | 0 | 1750 | 1.2 |

EXAMPLE 4

AlN sintered bodies having metallized layers were prepared similarly to Example 3, except that CaO was replaced by $CaCO_3$ or $Ca(NO_3)_2$. The firing condition was 120 minutes at a temperature of 1700° C. Table 4 shows the tensile strength of each sample thus obtained, which was measured similarly to Example 1. It is clear from Table 4 that all of the metallized layers formed in accordance with the present invention had an excellent junction strength. The samples of Example 4 also had an excellent airtightness which was measured in a similar manner to Example 3.

TABLE 4

| W Paste Sample No. | Content (wt. %) AlN | CaO | Firing Temperature (°C.) | Tensile Strength (kg/mm²) |
|---|---|---|---|---|
| 1 | 3 | 5 | 1700 | 8.3 |
| 2 | 5 | 5 | 1700 | 6.4 |
| 3 | 7 | 12 | 1700 | 10.0 |
| 4 | 10 | 16 | 1700 | 10.5 |
| 5 | 23 | 17 | 1700 | 6.3 |
| | AlN | Ca(NO₃)₂ | | |
| 6 | 1 | 4 | 1700 | 6.3 |
| 7 | 6 | 10 | 1700 | 9.1 |
| 8 | 10 | 15 | 1700 | 9.9 |
| 9 | 10 | 16 | 1700 | 10.0 |
| 10 | 15 | 18 | 1700 | 7.4 |
| 11 | 23 | 20 | 1700 | 5.1 |

EXAMPLE 5

CaO powder and $Al_2O_3$ powder were added to tungsten powder in each ratio as shown in Tables 5A and 5B and kneaded with an organic binder vehicle to form a paste. Each content (wt. %) is shown in the ratio of tungsten (wt. %)+CaO (wt. %)+$Al_2O_3$ (wt. %= 100 wt. %). Each paste thus obtained was coated on the surface of the respective sample of an AlN sintered body. After the coating the organic binder was removed. Thereafter, the samples were fired in a nitrogen atmosphere at a temperature of 1600° C. for 60 minutes, to obtain a metallized layer.

The metallized layer of each sample was nickel plated to a thickness of 2 to 3 μm and then gold plated to a thickness of 2 to 3 μm. Thereafter, a heat treatment was performed in the normal atmosphere at a temperature of 450° C. for 10 minutes, to examine any tarnishing and foaming on the plated surface. Table 5 shows the results. Further, an appearance inspection was made with a stereomicroscope at a magnification of forty times. Symbol A in Table 5 indicates a group of samples wherein 0 to 5% had a tarnished or foamed surface, symbol B indicates a group of samples wherein 5 to 10% were tarnished or foamed, and symbol C indicates a group of samples wherein at least 10% were tarnished or foamed.

Further, a surface area portion 2×2 mm in size, of each sample was nickel plated and the tensile strength was measured similarly to Example 1. Tables 5A and 5B also show the results of such measurement.

Figure 11:
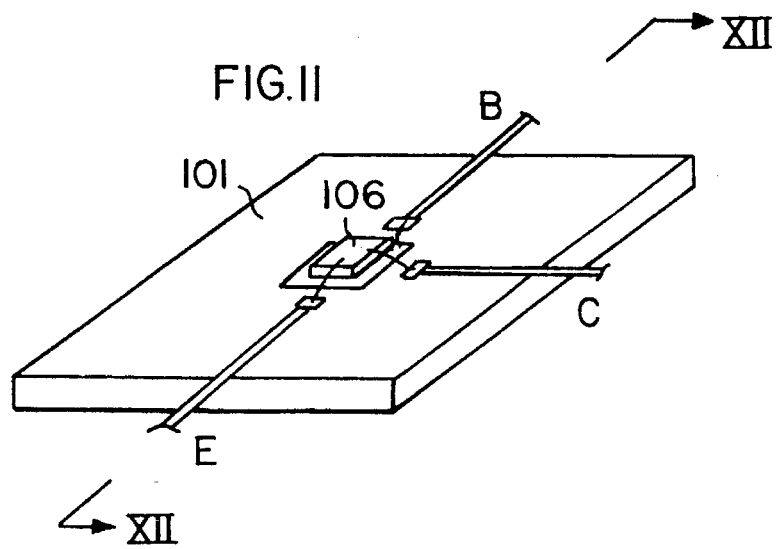
FIG. 11 is a perspective view of a test assembly used for measuring a thermal resistance of a metallized layer on an AlN sintered body according to the invention.
Figure 12:
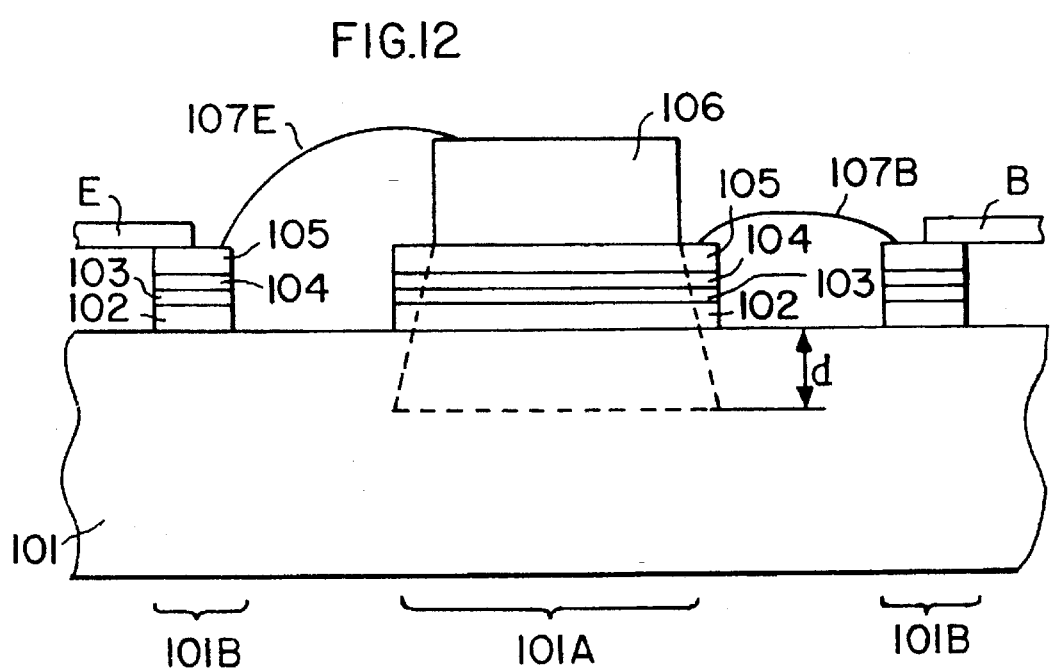
FIG. 12 is an enlarged cross-sectional view of the test assembly of FIG. 11, taken along the line XII—XII in FIG. 11.

Referring to FIGS. 11 and 12, a number of samples were prepared by forming a respective metallized layer 102 according to each content given in Tables 5A and 5B, in the middle of respective ones of the above-described AlN samples having dimensions of 10 mm×10 mm×1 mm, used as AlN substrate 101. Metallized layer 102 was formed with a thickness of approximately 15 μm on a transistor mount portion 101A (2 mm×2 mm) and terminal portions 101B for wire bonding. An Ni coat layer 103 with a thickness of 2–3 μm was formed on metallized layer 102. Then, an Au coat layer 104 with a thickness of 2–3 μm was formed on the surface of Ni coat layer 103. On the Au coat layer 104, a transistor 106 having area dimensions of j1.4 mm×1.4 mm was diebonded using an Au-Si solder 105 of eutectic crystal composition, with a solder thickness of 30 μm. The transistor 106 had a chip thermal resistance $\theta_{chip}$=0.8° C./W. Each of the peripheral wire bond terminal portions 101B was connected with an Au wire bond 107B, 107C, 107E, whereby the transistor was packaged in a driveable state with the bond wires 107B, 107C and 107E connected respectively to the transistor base, collector and emitter.

Figure 13:
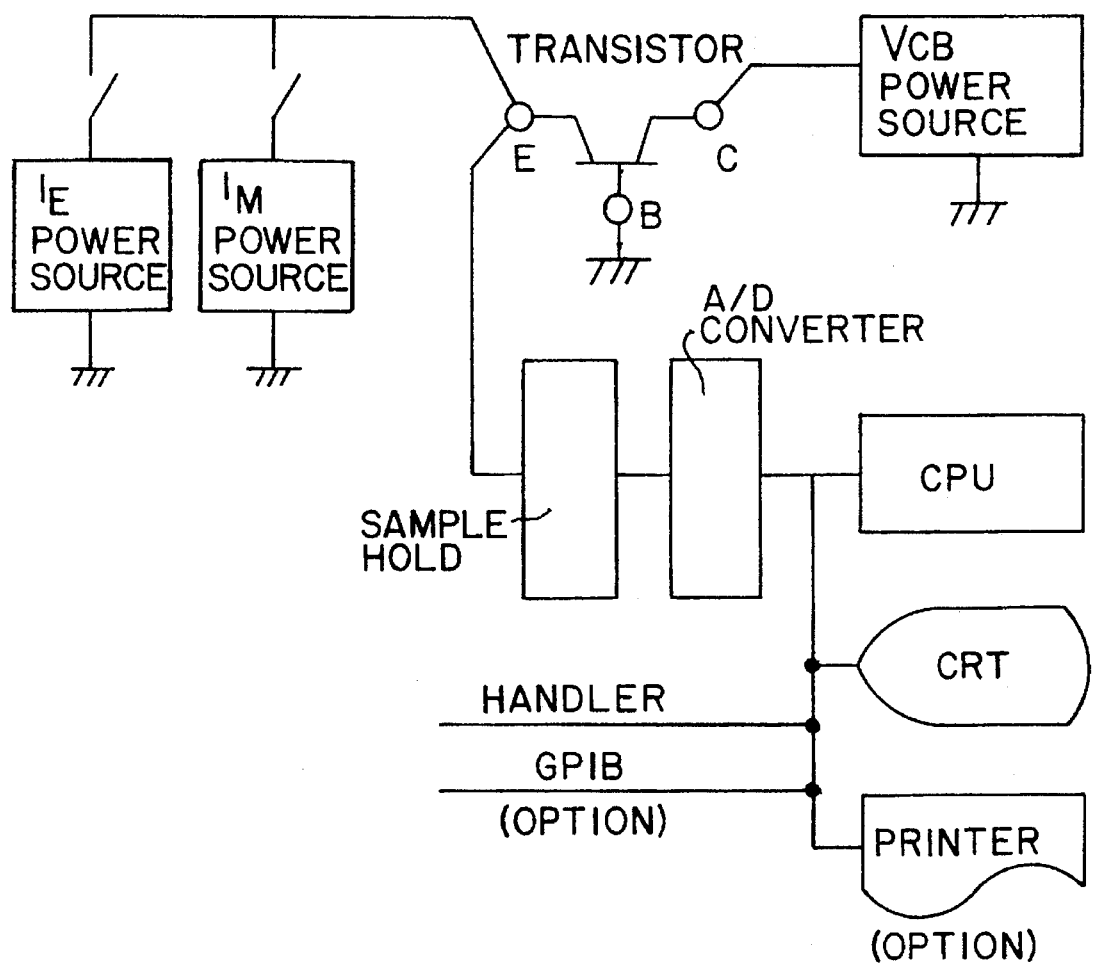
FIG. 13 is a schematic diagram of a test circuit for measuring a thermal resistance of a metallized layer on an AlN sintered body according to the invention.

The thermal resistance was measured for each sample according to a transient thermal resistance method ($V_{BE}$ method). A transient thermal resistance method is a method of identifying the change in temperature measured before and after applying power to a transistor, based on the known temperature dependency of forward voltage drop between E (emitter) and B (base) of a transistor. This method will be described hereinafter with reference to FIGS. 13 and 14.

A constant voltage ($V_{CB}$) was applied to a transistor to conduct a current ($I_R$) flow for a predetermined time (pulse duration 50 ms) to generate heat. The applied power P is represented by $P=V_{CB} \times I_E$. A small current ($I_M$) is applied before and after the flow of current $I_E$ applying the power P. The B-E voltage $V_{BE}$ proportional to the resistance $R_{BE}$ between B and E was measured.

Because $R_{BE}$ is proportional to $V_{BE}$ and varies substantially linearly with respect to temperature, the change in temperature ΔT of the transistor ship is obtained as:

$\Delta T \approx \Delta V_{BE} \approx V_{BE1}$ (Voltage Before Applying Power)–$V_{BE2}$ (Voltage After Applying Power)

from the difference ($\Delta V_{BE}$) between the voltages of $V_{BE1}$ and $V_{BE2}$ before and after applying power P. After applying P for a pulse time of 50 ms, a delay time period, termed "sample delay", is allowed to pass before $V_{BE2}$ is measured. The sample delay is set to 20 μs.

When a pulse is applied for 50 ms with an applied power of P=30W ($V_{CB}$=10V, $I_E$=3A) with a 1.4 mm×1.4 mm transistor (chip thermal resistance $\theta_{chip}$=0.8° C./W) to generate heat, the obtained thermal resistance value $\theta_{th}$ ie expressed as:

$$\theta_{th} = \theta_{chip} + \theta_{Au-31} + \theta_{plating} + \theta_{metallize} + \theta AlN$$

where $\theta_{Au-31}$ is the thermal resistance contribution of Au-Si solder 105; $\theta_{plating}$ the thermal resistance contribution of Ni coat layer 103 end Au coat layer 104; $\theta_{Metallize}$ is the thermal resistance contribution of metallized layer 102; end $\theta_{AlN}$ is the thermal resistance contribution of AlN sample substrate 101.

However, in the transient thermal resistance method, the power application and measurement period is too short a time period for extensive thermal conduction into the substrate, so that thermal conduction into the AlN substrate 101 is limited to the range of depth of approximately d=100≈500 μm (refer to FIG. 12). Therefore, the rise in temperature $\Delta T$ of the transistor is predominantly dependent upon $\theta_{Metallize}$ if the transistor, the Au-Si solder, the plating, and the AlN sample ere under the same conditions. $\theta_{Metallize}$ is determined by the composition and the formed state of the metallized layer, as described herein.

Using the above-described $V_{BE}$ measurement apparatus, a pulse of applied power P=30W was applied for 50 ms to generate heat in the transistor mounted respectively on metallized layers according to the compositions shown in Tables 5A and 5B. The thermal resistance was measured according to the transient thermal resistance method described above. The results are shown in Tables 5A and 5B.

Tensile strength and thermal resistance values of each sample are shown as average values of 10 and 5 measured values respectively.

Figure 9A:
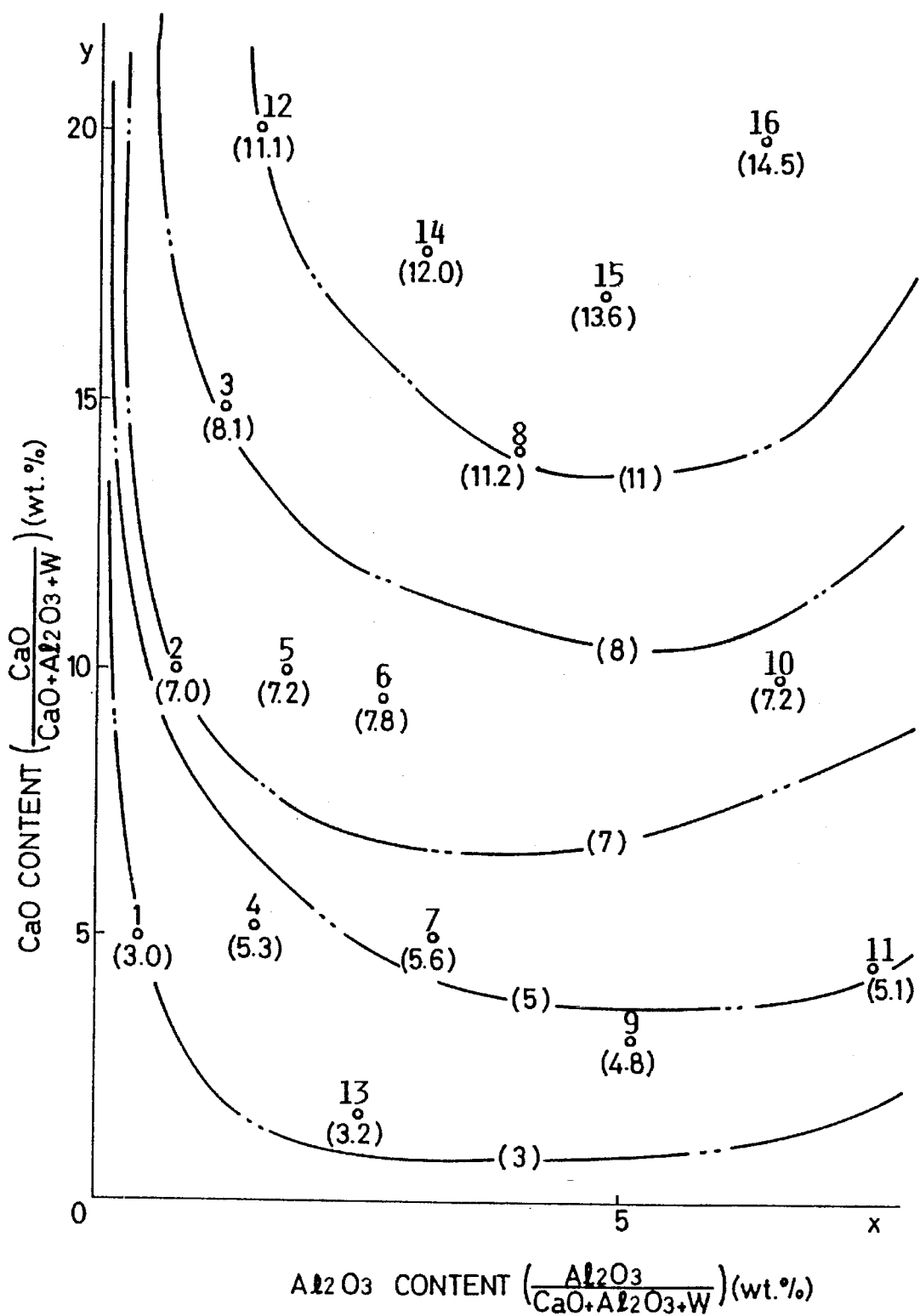
FIGS. 9A, 9B illustrate the adhesive strength and thermal resistance of metallized layers on aluminum nitride sintered bodies obtained according to Example 5 with reference to the contents of $Al_2O_3$ and CaO respectively.
Figure 9B:
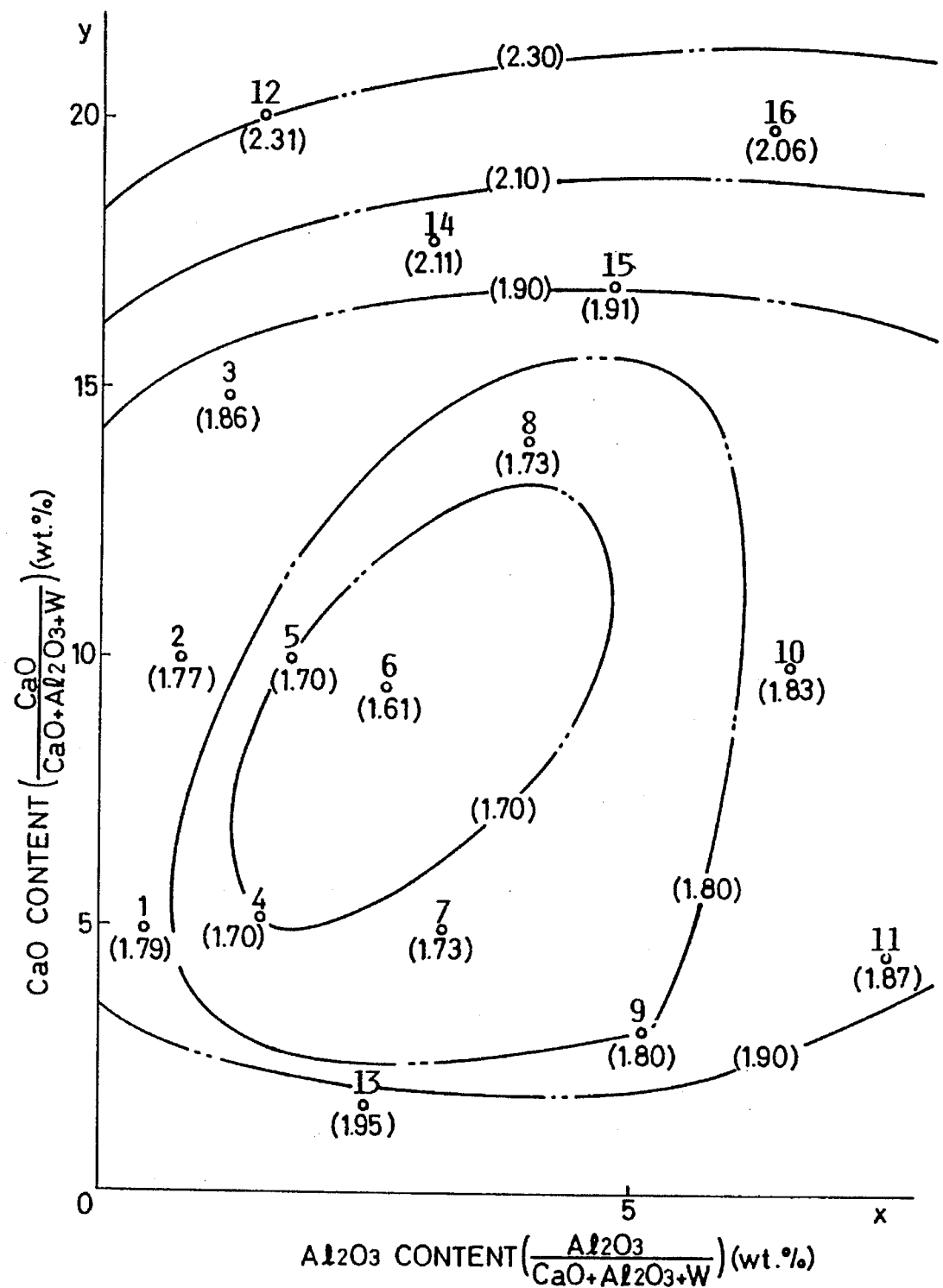

Referring to FIGS. 9A and 9B, numeric values in parenthesis represent tensile strength (in Kg/mm$^2$) and thermal resistance values (in ° C./W) respectively for each of the numbered samples in Tables 5A and 5B.

According to Table 5A, each metallized layer containing 0.4 to 10 percent by weight, preferably 0.4 to 5% by weight, of aluminum oxide, and 1 to 15 percent by weight of calcium oxide had a small tarnishing percentage in its gold plating. It is recognized that the plated layer formed on the metallized layer had a particularly excellent adhesive property within the ratio ranges shown. Further, it is recognized from FIG. 9A that each metallized layer containing 1 to 10 percent by weight of aluminum oxide and 10 to 20 percent by weight of calcium oxide, had a junction strength of at least about 7 kg/mm$^2$, which makes the present aluminum nitride sintered body suitable for use in a package substrate for a semiconductor device. According to FIG. 9B and Table 5A it is recognized that each AlN sintered body integrated with a transistor and having a metallized layer containing 0.4 to 10 percent by weight and preferably 1 to 10 percent by weight and more preferably 1 to 5 percent by weight of aluminum oxide and 3 to 15 percent by weight of calcium oxide, has a thermal resistance value of not more than about 1.9° C./W, which is critical to make the present sintered body suitable for use as part of a heat sink for a semiconductor device. Tables 5A and 5B as well as FIGS. 9A and 9B show that with regard to a high tensile strength and a suitable low thermal resistance, predictions cannot be made as a matter of course with regard to the CaO and $Al_2O_3$ content in the metallized layer.

A reference example was formed by firing tungsten paste materials independently containing 7 percent by weight of borosilicate glass. 15 percent by weight of CaO and 8 percent by weight of $Al_2O_3$, respectively, in a nitrogen atmosphere and a wet atmosphere similarly to Example 5. A tensile strength of each metallized layer thus obtained was not measurable and by far different from a practical level. Further, a paste identical in composition to that of Example 5 was fired in a wet atmosphere. The thermal resistance of an AlN sintered body having the metallized layer thus obtained was in excess of 2.5° C./W as measured in a similar manner as described above.

The value of 1.9° C./W of the present metallized layer is substantially equal to that of the heat resistance of metallized BeO substrates available on the market. This result is surprising because this invention is composed of a high heat conductive AlN and low heat resistant dense metallized layer compared to BeO.

The following Table 5A shows the critical ranges of $Al_2O_3$ and CaO for obtaining a low thermal resistance of 1.9° C./W which is critical for using the present sintered body as an effective heat sink for a semiconductor device.

TABLE 5A

| W Paste Sample No. | Content (wt. %) $Al_2O_3$ | CaO | Tensile Strength (kg/mm$^2$) | Thermal Resistance (°C./W) | Percentage Category of samples with a defective Au plated surface |
|---|---|---|---|---|---|
| 1 | 0.4 | 5.0 | 3.0 | 1.79 | A |
| 2 | 0.75 | 10.0 | 7.0 | 1.77 | A |
| 3 | 1.2 | 14.9 | 8.1 | 1.86 | A |
| 4 | 1.5 | 5.2 | 5.3 | 1.70 | A |
| 5 | 1.8 | 10.0 | 7.2 | 1.70 | A |
| 6 | 2.7 | 9.5 | 7.8 | 1.61 | A |
| 7 | 3.2 | 5.0 | 5.6 | 1.73 | A |
| 8 | 4.0 | 14.1 | 11.2 | 1.73 | A |
| 9 | 5.1 | 3.1 | 4.8 | 1.80 | B |
| 10 | 6.5 | 9.9 | 7.2 | 1.83 | B |
| 11 | 7.4 | 4.5 | 5.1 | 1.87 | B |

The following Table 5B shows that too little or too much CaO raises the thermal resistance above the desirable maximum value of 1.9° C./W. thus, it is not predictable how changing the CaO content will affect the thermal resistance of the metallized layer.

TABLE 5B

| W Paste Sample No. | Content (wt. %) $Al_2O_3$ | CaO | Tensile Strength (kg/mm$^2$) | Thermal Resistance (°C./W) | Percentage Category of samples with a defective Au plated surface |
|---|---|---|---|---|---|
| 12 | 1.5 | 20.1 | 11.1 | 2.31 | C |
| 13 | 2.5 | 1.7 | 3.2 | 1.95 | A |
| 14 | 3.1 | 17.8 | 12.0 | 2.11 | B |
| 15 | 4.8 | 17.0 | 13.6 | 1.91 | B |

TABLE 5B-continued

| W Paste Sample No. | Content (wt. %) | | Tensile Strength (kg/mm²) | Thermal Resistance (°C./W) | Percentage Category of samples with a defective Au plated surface |
|---|---|---|---|---|---|
| | Al₂O₃ | CaO | | | |
| 16 | 6.3 | 19.9 | 14.5 | 2.06 | C |

Furthermore, referring to Table 5C, 60 samples were prepared for evaluation using four different AlN substrate materials, having respective thermal conductivities of 120, 170, 220 and 250 W/mK. On each type of substrate, three samples of each of five types having different metallized layers were prepared, namely one according to the invention, two comparative samples outside the literal terms of the present claims, one layer according to U.S. Pat. No. 4,835, 039 (Barringer et al.) (col. 3, lines 13–27; claim 1), and one layer according to U.S. Pat. No. 4,493,789 (Ueyama et al.) (col. 2, lines 47–54; Tables 1,2; claim 1). The thermal resistance was measured for each of these samples using the transient thermal resistance method described above, and the results of the measurement are shown in Table 5C in comparison with the present invention.

Change in the measured thermal resistance dependent on a change in the thermal conductivity of the AlN sintered body was also examined, based on the results obtained for samples having substrates of different thermal conductivity. However, as described above, there is not a substantial influence on the thermal resistance even if the thermal conductivity of the AlN sintered body differs because heat conducts only into a small portion of the AlN sintered body in the transient thermal resistance measurement.

As can be seen in Table 5C, the metallized layer according to the invention achieves a lower thermal resistance than the comparative samples and than the samples according to Barringer et al. and Ueyama et al. Furthermore, the samples according to Barringer et al. and Ueyama et al. fail to achieve the desirable low thermal resistance of not greater than 1.9° C./W as achieved. according to the invention.

More specifically, all the samples in Table 5C prepared with a metallized layer according to the invention have a thermal resistance less than 1.9° C./W, because the metallized layer is dense and has a good adhesion to the substrate. On the other hand, the samples prepared according to Barringer have a thermal resistance about three times that of the samples of the invention, because the Barringer layer is not dense and has a relatively poor adhesion to the substrate. The samples prepared according to Ueyama achieve an even worse thermal resistance than those of Barringer.

TABLE 5C

| Thermal Conductivity of AlN [W/m · K] | Metallized Layer Components | 1 INVENTION W: 84 wt % Al₂O₃: 8 wt. % CaO: 8 wt. % | 2 W content too low W: 71 wt. % Al₂O₃: 12 wt. % CaO: 17 wt. % | 3 W content too high W: 97.8 Wt. % Al₂O₃: 0.2 wt. % CaO: 2.0 wt. % | 4 Barringer et al. W: 90 vol % Glass: 10 vol. % Al₂O₃: 40 wt. % CaO: 20 wt. % SiO₂: 40 wt. % | 5 Ueyama et al. W: 100 weight Parts Glass: 1 weight Part Al₂O₃: 5 wt. % SiO₂: 60 wt. % MgO: 15 wt. % CaCO₃: 20 wt. % |
|---|---|---|---|---|---|---|
| 120 | Thermal Resistance (°C./W) (Number of Samples: = 3) | 1.4 | 3.2 | 2.8 | 4.8 | 4.5 |
| | | 1.7 | 4.0 | 3.1 | 5.0 | 4.8 |
| | | 1.8 | 3.7 | 2.3 | 3.9 | 5.3 |
| 170 | | 1.3 | 3.1 | 2.6 | 4.8 | 4.4 |
| | | 1.7 | 4.0 | 3.0 | 5.0 | 4.7 |
| | | 1.6 | 3.5 | 2.3 | 4.0 | 5.3 |
| 220 | | 1.2 | 3.0 | 2.6 | 4.7 | 4.5 |
| | | 1.7 | 3.8 | 3.0 | 4.9 | 4.7 |
| | | 1.4 | 3.5 | 2.3 | 3.9 | 5.2 |
| 250 | | 1.1 | 2.8 | 2.6 | 4.8 | 4.4 |
| | | 1.5 | 3.7 | 2.9 | 4.9 | 4.7 |
| | | 1.4 | 3.4 | 2.2 | 3.9 | 5.2 |

EXAMPLE 6

Similarly to Example 5, CaO powder and Al₂O₃ powder were added to molybdenum powder in each ratio as shown in Table 6 and kneaded with an organic binder vehicle to make a paste. The content (wt. %) of each paste was adjusted to satisfy the conditions of molybdenum (wt. %)+CaO (wt. %)+Al₂O₃ (wt. %)=100 (wt. %). Each paste was coated on the surface of the respective sample prepared by an AlN sintered body whereupon the binder was removed. Thereafter, the samples were fired in a nitrogen atmosphere at a temperature of 1550° C. for 30 minutes, to obtain a metallized layer.

A nickel layer 2 to 3 μm thick was plated onto the metallized layer. Then a gold layer 2 to 3 μm thick was plated on the nickel layer of each sample, which was then subjected to heat treatment in the atmosphere at a temperature of 450° C. for 10 minutes, to examine any tarnishing and foaming on the plated surface. Table 6 shows the results of such examination, similarly to Example 5.

Table 6 also shows the measured tensile strength of each sample, similarly to Example 5.

Further, processing similar to that in Example 5 was performed on each sample, to evaluate the thermal resistance of the AlN sintered body integrated with a transistor. Table 6 also shows the measured thermal resistance for each sample.

excess of 3.5° C./W measured similarly as described above.

TABLE 6

| Mo Paste Sample No. | Content (wt. %) | | Tensile Strength (kg/mm²) | Thermal Resistance (°C./W) | Tarnishing Frequency of Au Plating |
|---|---|---|---|---|---|
| | $Al_2O_3$ | CaO | | | |
| 1 | 0.4 | 10.0 | 5.2 | 2.86 | A |
| 2 | 0.5 | 3.9 | 3.2 | 2.98 | A |
| 3 | 0.8 | 20.0 | 6.9 | 2.77 | A |
| 4 | 1.1 | 26.5 | 7.2 | 2.88 | B |
| 5 | 1.4 | 36.0 | 8.4 | 2.96 | C |
| 6 | 1.8 | 17.2 | 7.4 | 2.69 | A |
| 7 | 1.8 | 2.0 | 3.0 | 2.89 | A |
| 8 | 2.3 | 17.0 | 8.2 | 2.63 | A |
| 9 | 2.7 | 25.6 | 9.3 | 2.68 | A |
| 10 | 3.0 | 7.1 | 6.1 | 2.70 | A |
| 11 | 3.5 | 24.9 | 9.8 | 2.71 | A |
| 12 | 3.5 | 33.6 | 10.4 | 2.85 | C |
| 13 | 4.2 | 30.0 | 10.9 | 2.78 | B |
| 14 | 4.4 | 4.4 | 5.7 | 2.80 | A |
| 15 | 6.3 | 14.8 | 7.1 | 2.90 | B |
| 16 | 7.0 | 6.8 | 3.4 | 3.00 | B |

Figure 10A:
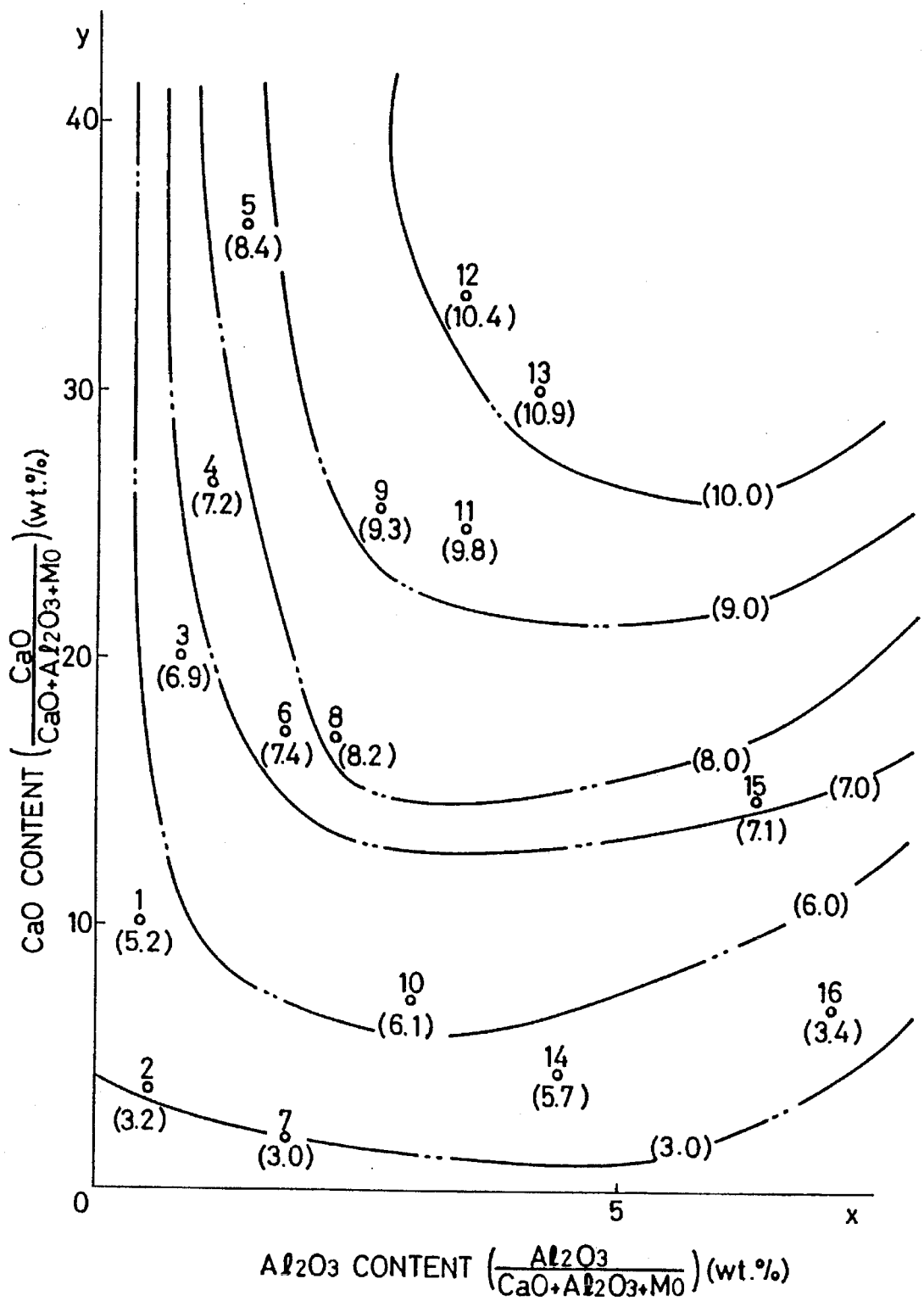
FIGS. 10A, 10B illustrate the adhesive strength and thermal resistance of metallized layers on aluminum nitride sintered bodies obtained according to Example 6 with reference to the contents of $Al_2O_3$ and CaO respectively.
Figure 10B:
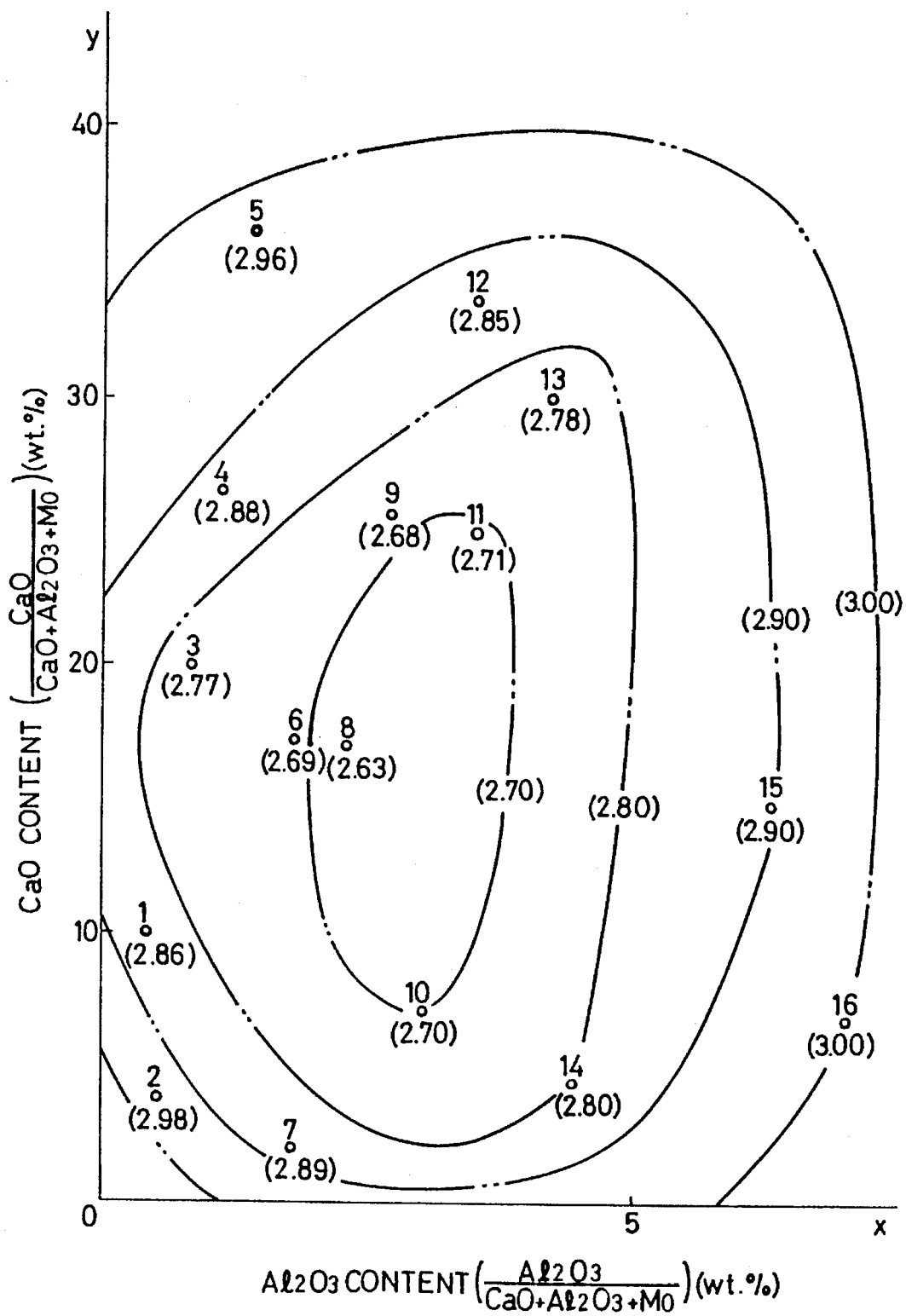

The tensile strength is shown as an average value of ten measured values per sample, and the thermal resistance is shown in an average value of five measured values per sample. FIG. 10A illustrates measured values of the tensile strength with reference to the contents of $Al_2O_3$ and CaO. FIG. 10B illustrates the thermal resistance values with reference to the contents of $Al_2O_3$ and CaO. Numeric values in parenthesis show tensile strength values and thermal resistance values in FIGS. 10A and 10B respectively.

It is clear from Table 6 that the percentage of a tarnished surface of the gold plated surface of each metallized layer containing 1 to 5 percent by weight of aluminum oxide and 1 to 25 percent by weight of calcium oxide, is small. The gold plating also has an excellent adhesive or bonding property. According to FIG. 10A, each metallized layer containing 1 to 10 percent by weight of aluminum oxide and 15 to 35 percent by weight of calcium oxide, shows a junction strength, being evaluated as tensile strength of at least about 7 kg/mm². This features makes the present sintered body preferable for use as a part of a substrate for a semiconductor device requiring an excellent junction strength. Further, according to FIG. 10B, each AlN sintered body having a metallized layer containing 1 to 7 percent by weight of aluminum oxide and 1 to 35 percent by weight of calcium oxide, shows a thermal resistance value of not more than about 3.0° C./W in integration with a transistor. This feature makes the present AlN sintered body preferable for use as a part requiring a good thermal conductivity.

A reference example was formed by firing molybdenum paste materials independently containing 14 percent by weight of borosilicate glass, 18 percent by weight of CaO and 7 percent by weight of $Al_2O_3$, respectively, as assistants in a nitrogen atmosphere and a wet atmosphere similarly to Example 6. The tensile strength of each metallized layer was unmeasurable and by far different from a practical level. Further, the paste used was identical in composition to that in Example 6 and firing took place in a wet atmosphere to obtain a metallized layer. The thermal resistance of an AlN sintered body provided with this metallized layer, was in excess of 3.5° C./W measured similarly as described above.

EXAMPLE 7

Calcium nitrate powder and aluminum oxide powder were fully mixed in the ratio of 30 g to 5 g, and fired in the air at a temperature of 1350° C. for three hours. The fired substance thus obtained was a mixture of $xCaO \cdot yAl_2O_3$ (x,y: an integer) and CaO. The fired mixture was then pulverized by a ball mill. 30 percent by weight of the powder thus obtained was blended with 70 percent by weight of molybdenum powder and an organic binder vehicle was added to the same to form a molybdenum paste. The molybdenum paste was screen-printed on the surface of an AlN sintered body in a pattern having an area of 2 mm by 2 mm, and then fired in a nitrogen atmosphere at the firing temperatures shown for each sample in Table 7 for 120 minutes. A nickel layer was plated on the surface of each metallized layer. The tensile strength was measured similarly as in Example 1. After the nickel plating, a gold layer was plated onto the nickel layer and a field-effect high-power transistor was secured to the gold layer similarly to Example 5, to measure the thermal resistance also shown in Table 7.

TABLE 7

| Mo Paste Sample No. | Firing Temperature (°C.) | Tensile Strength (kg/min²) | Thermal Resistance (°C./W) |
|---|---|---|---|
| 1 | 1450 | 0.9 | 3.10 |
| 2 | 1500 | 3.8 | 1.74 |
| 3 | 1550 | 7.9 | 1.66 |
| 4 | 1600 | 8.1 | 1.62 |
| 5 | 1650 | 8.4 | 1.72 |
| 6 | 1700 | 6.4 | 1.88 |
| 7 | 1750 | 4.3 | 2.10 |

While each aluminum compound was prepared by aluminum oxide or aluminum nitride in the aforementioned Examples, a similar function or effect can be attained by employing aluminum oxynitride.

According to the present invention as hereinabove described, a metallized layer, which adheres strongly to an aluminum nitride sintered body, can be obtained with a high airtightness and an excellent thermal conductivity. Further, the firing of the metal paste coated on an aluminum nitride sintered body, can be performed in an inert atmosphere.

The foregoing Tables 1, 5 and 6 show, with the exception of sample 6 in Table 1, that for obtaining a mechanical bonding strength of at least 5.3 kg/mm² between the sintered aluminum nitride body and the metallized layer on said body it is critical to have a ratio of CaO Al₂O₃ of at least one, preferably of at least two.

Although the present invention has been described and illustrated in detail, it is clearly understood that the same is by way of illustration and example only and is not to be taken by way of limitation, the spirit and scope of the present invention being limited only by the terms of the appended claims.

What we claim is:

1. An article of manufacture comprising an aluminum nitride sintered body and a metallized layer on a surface of said sintered body, said metallized layer consisting of 0.4 to 10% by weight aluminum oxide, 3 to 15% by weight calcium oxide, and the remainder being tungsten, wherein said metallized layer has a thermal resistance not greater than 1.9° C./W; said thermal resistance being defined as the thermal resistance measured by forming a sample of said metallized layer to a thickness of approximately 15 μm on an area of 2 mm×2 mm on a sample of said aluminum nitride sintered body, forming an Ni coat layer to a thickness of 2 to 3 μm on the sample metallized layer, forming an Au coat layer to a thickness of 2 to 3 μm on the Ni coat layer, die-bonding on the Au coat layer a transistor having a bonding area of 1.4 mm×1.4 mm and a chip resistance $\theta_{chip}$=0.8° C./W using an Au-Si solder having a eutectic crystal composition and a thickness of about 30 μm, packaging the transistor in a driveable state, applying an electrical pulse with an applied power of P=30W for 50 ms to the packaged transistor so that heat is generated in the transistor, and measuring the thermal resistance by the $V_{Be}$ transient thermal resistance method.

2. The article of manufacture of claim 1, wherein said metallized layer consists of 1 to 5% by weight aluminum oxide, 3 to 15% by weight calcium oxide, and the remainder being tungsten.

3. The article of manufacture of claim 1, wherein said metallized layer consists of 1 to 5% by weight aluminum oxide, 5 to 13% by weight calcium oxide, and the remainder being tungsten.

4. The article of manufacture of claim 1, wherein said metallized layer is formed by firing a coating paste in a substantially dry inert gas atmosphere.

5. The article of manufacture of claim 1, further comprising an Ni coat layer formed on said metallized layer, an Au coat layer formed on said Ni coat layer, an Au-Si solder layer formed on said Au coat layer and a semiconductor device disposed on said Au-Si solder layer.

6. An article of manufacture comprising an aluminum nitride sintered body and a metallized layer on a surface of said sintered body, said metallized layer consisting of 0.4 to 10% by weight aluminum oxide, 3 to 15% by weight calcium oxide, and the remainder being tungsten, wherein said metallized layer has a thermal resistance not greater than 1.9° C./W.

7. The article of manufacture of claim 6, wherein said metallized layer consists of 1 to 5% by weight aluminum oxide, 3 to 15% by weight calcium oxide, and the remainder being tungsten.

8. The article of manufacture of claim 6, wherein said metallized layer consists of 1 to 5% by weight aluminum oxide, 5 to 13% by weight calcium oxide, and the remainder being tungsten.

9. The article of manufacture of claim 6, wherein said metallized layer is formed by firing a coating paste in a substantially dry inert gas atmosphere.

10. The article of manufacture of claim 6, further comprising an Ni coat layer formed on said metallized layer, an Au coat layer formed on said Ni coat layer, an Au-Si solder layer formed on said Au coat layer and a semiconductor device disposed on said Au-Si solder layer.

11. The article of manufacture of claim 6, wherein said thermal resistance pertains per area of about 4 mm² of said metallized layer.

12. The article of manufacture of claim 11, wherein said thermal resistance pertains per thickness of about 15 μm of said metallized layer.

13. The article of manufacture of claim 6, wherein said thermal resistance pertains per area of about 2 mm² of said metallized layer.

14. The article of manufacture of claim 13, wherein said thermal resistance pertains per thickness of about 15 μm of said metallized layer.

* * * * *

UNITED STATES PATENT AND TRADEMARK OFFICE
CERTIFICATE OF CORRECTION

PATENT NO. : 5,529,852
DATED : June 25, 1996
INVENTOR(S) : Sasame et al.

It is certified that error appears in the above-identified patent and that said Letters Patent is hereby corrected as shown below:

Col. 2, line 15, replace "SiOn" by --$SiO_2$--;
   line 34, replace "$H_2 - H_2$" by --$H_2 - N_2$--.
Col. 9, line 54, replace "valves," by --values,--.
Col. 10, line 58, after "for" insert --60--.
Col. 12, line 41, replace "j1.4 mm" by --1.4 mm--.
Col. 13, line 12, replace "P - 30W" by --P = 30W--;
   line 14, replace "ie" by --is--;
   line 17, replace the line to read:
--$\theta_{th} = \theta_{chip} + \theta_{Au-Si} + \theta_{plating} + \theta_{Metallize} + \theta_{AlN}$--;
   line 29, replace "d = 100 = 500" by --d - 100 ~ 500--;
   line 33, replace "ere" by --are--;
   line 19, replace "$\theta_{Au31}$" by --$\theta_{AuSi}$--.
Col. 14, line 11, replace "glass." by --glass,--;
   line 52, replace "thus," by --Thus,--.
Col. 18, Table 7, column 3, box 1, replace "(kg/min$^2$" by --(kg/mm$^2$)--.

Signed and Sealed this

Fifteenth Day of October, 1996

Attest:

BRUCE LEHMAN

*Attesting Officer*   *Commissioner of Patents and Trademarks*